United States Patent [19]

Moore et al.

[11] Patent Number: 5,023,568
[45] Date of Patent: Jun. 11, 1991

[54] COMBINED CURRENT DIFFERENCING AND OPERATIONAL AMPLIFIER CIRCUIT

[75] Inventors: Paul A. Moore, Hove; Colin L. Perry, Crawley, both of England; Johannes O. Voorman, Eindhoven, Netherlands

[73] Assignee: U.S. Philips Corporation, New York, N.Y.

[21] Appl. No.: 540,017

[22] Filed: Jun. 18, 1990

[30] Foreign Application Priority Data

Jul. 28, 1989 [GB] United Kingdom ............. 8917340.5

[51] Int. Cl.$^5$ ............................................. H03F 3/45
[52] U.S. Cl. ..................................... 330/257; 330/259
[58] Field of Search ......................... 330/257, 260, 259

[56] References Cited

U.S. PATENT DOCUMENTS 3,852,679 12/1974 Schade, Jr. ......................... 330/257
4,723,110 2/1988 Voorman ............................ 330/258

*Primary Examiner*—Eugene R. Laroche
*Assistant Examiner*—Tan Xuan Dinh
*Attorney, Agent, or Firm*—Bernard Franzblau

[57] ABSTRACT

A combined current difference and operational amplifier circuit (10) for use either as or in a filter embodied in an integrated receiver includes inputs ($I_A$ and $I_B$) for oppositely phased current signals which are applied to a current mirror circuit formed by first and second NPN transistors (Q1,Q2) having their bases connected to a junction (20). Equal value resistors (R1,R2) are serially connected in the emitter circuits of the first and second transistors, respectively and the current inputs are coupled to the free ends of the resistors. The base-collector path of a third NPN transistor (Q3) is connected between the free end of one of the resistors (R1) and the junction (20). A current difference signal ($i_b-i_a$) derived from the free end of the other one of the resistors is applied to the virtual ground input of an operational amplifier formed by a common emitter stage (Q4) coupled to an emitter follower (Q5). The operational amplifier has a capacitive (C1) feedback between its output and virtual ground input so that the d.c. potential at said input has no effect on the d.c. operating point of the output.

As an alternative, resistive (Rf) feedback may be used instead of the capacitive feedback. Another embodiment (FIG. 2) enables the input and output voltage swings to be increased without unduly degrading the bandwidth.

15 Claims, 2 Drawing Sheets

COMBINED CURRENT DIFFERENCING AND OPERATIONAL AMPLIFIER CIRCUIT

BACKGROUND OF THE INVENTION

The present invention relates to a combined current differencing and operational amplifier circuit which can be fabricated as an integrated circuit and has particular, but not exclusive, application either as or in a filter in an integrated receiver.

If the output of a current differencing circuit, when considered as a separate block, is connected to an amplifier, when considered as a separate block, a problem arises due to the fact that an output offset current of the current differencing circuit does not match the input offset current of the operational amplifier. Accordingly when implementing a combined current differencing circuit and amplifier it is not desirable to simply connect the output of one part to the input of the other part.

Another aspect of implementing the combined circuit is that the current inputs to the differencing circuit may be derived from a voltage-controlled current source generally termed a transconductor. The simplest transconductor is a differential amplifier by means of which a voltage applied between the base electrodes of the different amplifier is converted into two collector signal currents of opposite phase. Normally if the transconductor is implemented using NPN transistors, then the current differencing circuit will normally be implemented using PNP transistors. As is known NPN transistors have a number of beneficial features when compared with PNP transistors in standard bipolar integrated circuit processes as they are capable of operating over a greater frequency range and have less parasitics. Accordingly it is desirable to be able to minimise the usage of PNP transistors when fabricating the current differencing circuit, especially if the input signal currents are derived from a transconductor.

SUMMARY OF THE INVENTION

An object of the present invention is to overcome the problem of output/input offset currents when combining a current difference circuit and an operational amplifier.

According to the preset invention there is provided a combined current differencing and operational amplifier circuit comprising first, second, third, fourth and fifth NPN transistors each having base, emitter and collector electrodes, a feedback element, and first and second resistive elements having first and second ends. The base electrodes of the first and second transistors are connected together to form a junction, and the first ends of the first and second resistive elements are connected to the emitter electrodes of the first and second transistors, respectively. The base and collector electrodes of the third transistor are coupled respectively to the second end of the first resistor and to said junction. The base and collector electrodes of the fourth transistor are coupled respectively to the second end of the second resistive element and to the base electrode of the fifth transistor. The feedback element is connected between the base electrode of the fourth transistor and the emitter electrode of the fifth transistor. First and second signal inputs are coupled to the second ends of the first and second resistive elements respectively and a signal output is derived from the emitter circuit of the fifth transistor.

Avoiding the use of lateral PNP transistors in the signal paths enables the circuit in accordance with the present invention to achieve a wide bandwidth.

The feedback element may comprise a capacitor in which case the circuit can be used as an integrator, or may comprise a resistor in which case the circuit can be used as an amplifier. The circuit when used as an integrator automatically compensates for current-differencing circuit offset and operational amplifier input bias currents and exploits the fact that the voltage at the non-inverting input of the operational amplifier input is irrelevant.

If desired the circuit may further comprise first and second PNP transistors having emitter, base and collector electrodes, wherein the emitter-collector circuits of the first and second PNP transistors are coupled between the second ends of the first and second resistive elements and the base electrodes of the third and fourth NPN transistors, respecitvely. First and second capacitive elements are connected in parallel with the collector-emitter circuits of the first and second PNP transistors, respecitvely, and the base electrodes of the first and second PNP transistors are connected to a source of reference voltage. The provision of the first and second PNP transistors, in their common base mode, in the signal paths between the first and third and the second and fourth NPN transistors, respectively, enables the output swing of the operational amplifier to be increased from about 1 volt to a value close to the power supply voltage, say 5 volts, while not degrading the bandwidth unduly and without the value of the reference voltage having to be so small that the input swing of the transconductor is limited.

In the event that the signal to noise ratio of the circuit including the first and second PNP transistors is unacceptable, then the signal to noise ratio may be improved by providing sixth and seventh NPN transistors connected as emitter followers between the second ends of the first and second resistors and the emitter electrodes of the first and second PNP transistors, respectively.

The present invention further relates to an integrated communications receiver including one or more combined current differencing and operational amplifier circuits made in accordance with the present invention.

BRIEF DESCRIPTION OF THE DRAWINGS

The present invention will now be described, by way of example, with reference to the accompanying drawings, wherein.

DESCRIPTION OF THE PREFERRED EMBODIMENTS

Figure 1:
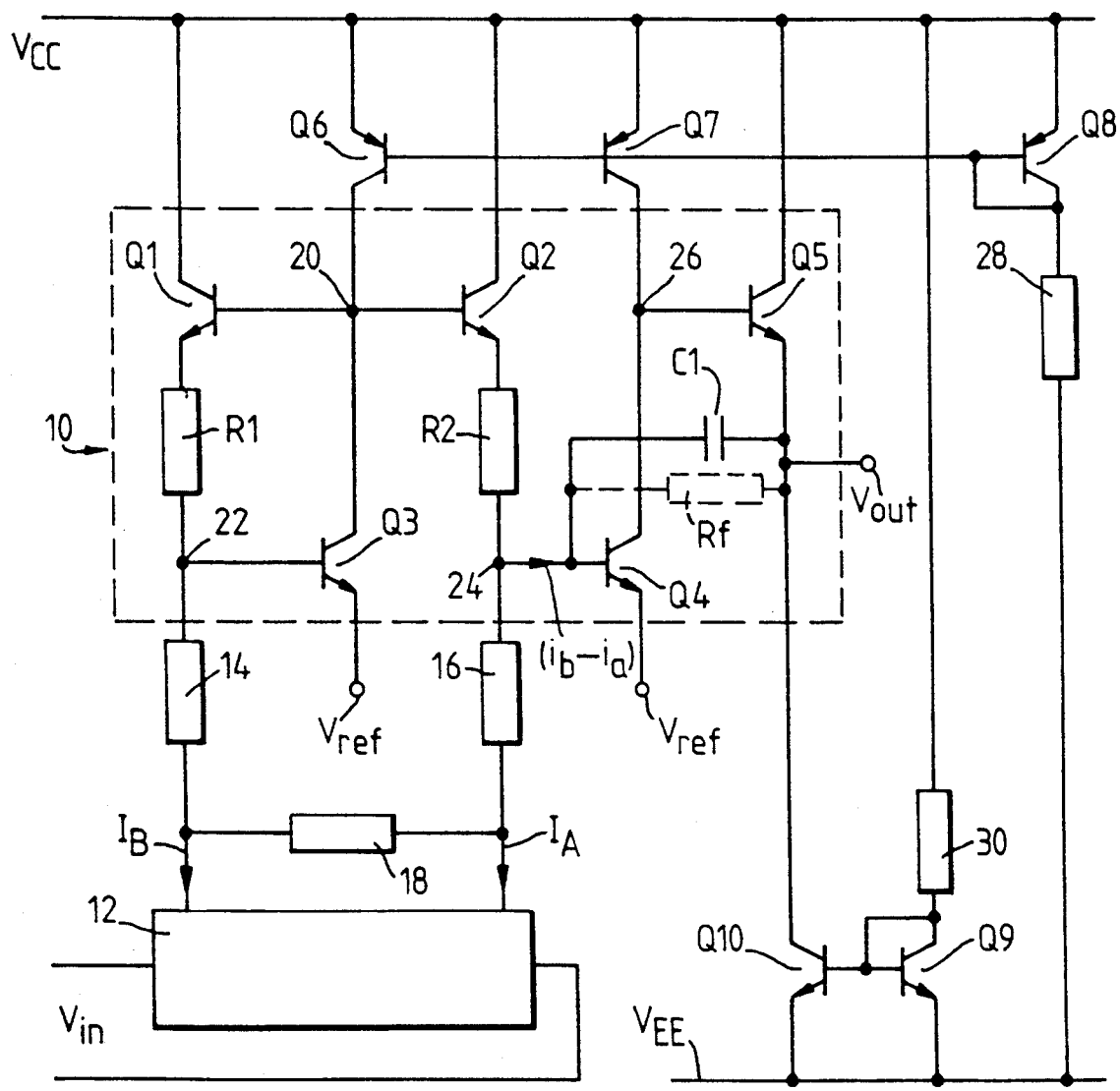
FIG. 1 is a circuit diagram, partly in block form, of a first embodiment of a combined current differencing and operational amplifier circuit in accordance with the present invention.

In the drawings the same reference numerals have been used to indicate corresponding elements. For convenience of description, the circuits will be described in their mode of use as integrators in which a capacitor C1 is provided in the feedback path of an operational amplifire formed by the NPN transistors Q4. Q5. However, by substituting a resistor Rf (shown in broken lines in FIG.

1), the mode of use of the circuit becomes that of an amplifier.

Referring to FIG. 1, the combined current differencing and operational amplifier circuit 10 proper is shown in the broken line box and the components outside the box comprise a transconductor 12 for converting an input voltage $V_{in}$ into two current signals $I_A$ and $I_B$ of opposite phase and other components relating to providing current supplies to others of the components. The transconductor 12 may be of a known type, for example as disclosed in FIG. 4a or 4b of EP-A-0234655. The current signals $I_A$ and $I_B$ each comprise the sum of the signals proper $i_a$ or $i_b$ plus a bias current I, that is $I_A = i_a + I$ and $I_B = i_b + I$.

The current signals $I_A$ and $I_B$ are applied to the circuit 10 by way of a current divider formed by series resistors 14,16 of equal value and a shunt resistor 18.

The circuit 10 comprises substantially identical NPN transistors Q1 to Q5, resistors R1 and R2 of substantially the same value and an integrating capacitor C1. The base electrodes of the transistors Q1, Q2 are connected together to form a junction 20. The resistors R1 and R2 respectively connect the emitter electrodes of the transistors Q1, Q2 to the resistors 14,16; the junctions being referenced 22, 24, respectively. The collector electrodes of the transistors Q1, Q2 are connected to the voltage supply line $V_{cc}$.

The collector and base electrodes of the transistor Q3 are respectively connected to the junctions 20 and 22, while its emitter electrode is connected to a reference voltage source $V_{ref}$. The junction 20 is connected to an active load formed by a PNP transistor Q6 which comprises part of a current mirror circuit including a diode connected PNP transistor Q8 and a series resistor 28.

The current difference signal $(i_b - i_a)$ at the junction 24 is applied to the base electrode of the amplifying transistor Q4, whose collector electrode is connected to a junction 26 and whose emitter electrode is connected to the reference voltage source $V_{ref}$. An active load formed by a PNP transistor Q7 is connected to the junction 26. The transistors Q7, Q8 also form a current mirror circuit.

The transistor Q5, which functions as an emitter follower, has its base electrode connected to the junction 26, its collector electrode connected to the line $V_{cc}$ and its emitter electrode connected to a current source formed by a current mirror circuit comprising a resistor 30 and NPN transistors Q9, Q10. The integrating capacitor C1 is connected between the base and emitter electrodes of the transistors Q4 and Q5, respectively. An output voltage $V_{out}$ is derived from the emitter circuit of the transistor Q5. The illustrated circuit may be used either as or in a filter embodied in an integrated communications receiver circuit.

The operation of the circuit 10 will be described as follows:

The transistors Q1 and Q3 together with the resistor R1 form a feedback loop which converts the signal current $I_B$ into a signal voltage between the base and emitter electrodes of the transistor Q1. Due to the voltage drop across the resistor R2 and the base-emitter junction of the transistor Q3, the potential at the emitsame as that across the resistor R1 and the base-emitter junction of the transistor Q1, the potential at the emitters of the transistors Q1 and Q2 are substantially the same. As the base electrodes of the transistors Q1 and Q2 are directly connected, then the base-emitter voltages, $V_{be}$, of the transistors Q1, Q2 are the same and hence a current mirror action occurs. The mirrored current $I_B$ is now combined with the signal current $I_A$ and the resultant current $(i_b - i_a)$, that is, the difference of the signal currents $I_B$, $I_A$ (or $(I+i_b),(I+i_a)$), flows into the base circuit of the transistor Q4.

The operational amplifier consists of a common emitter stage formed by the transistor Q4 with its active load, PNP transistor Q7, followed by a class A output stage consisting of the emitter follower transistor Q5 and the current source, transistor Q10. The base electrode of the transistor Q4 is the operational amplifier's virtual ground input, and so feedback is connected between this point and the emitter electrode of the transistor Q5. By connecting the capacitor C1 in the feedback path, the feedback is purely capacitive so that the d.c. potential at the virtual ground input has no effect on the d.c. operating point at which the output sits. This means that the value of $V_{ref}$ can be chosen to allow the optimum output voltage swing in conjunction with the input signal voltage swing at the input of the transconductor 12.

In the illustrated embodiment the value of the resistors R1, R2 is 390 ohms. A guide to the choice of the value of the resistors R1, R2 is that it should be as high as possible subject to not affecting the circuit's operation for example by avoiding $V_{cc}$ being lost across the resistor R1 or R2. In order to ensure this $$V_{R1} \leq V_{cc} - V_{ref} - V_{satQ1}$$

Figure 2:
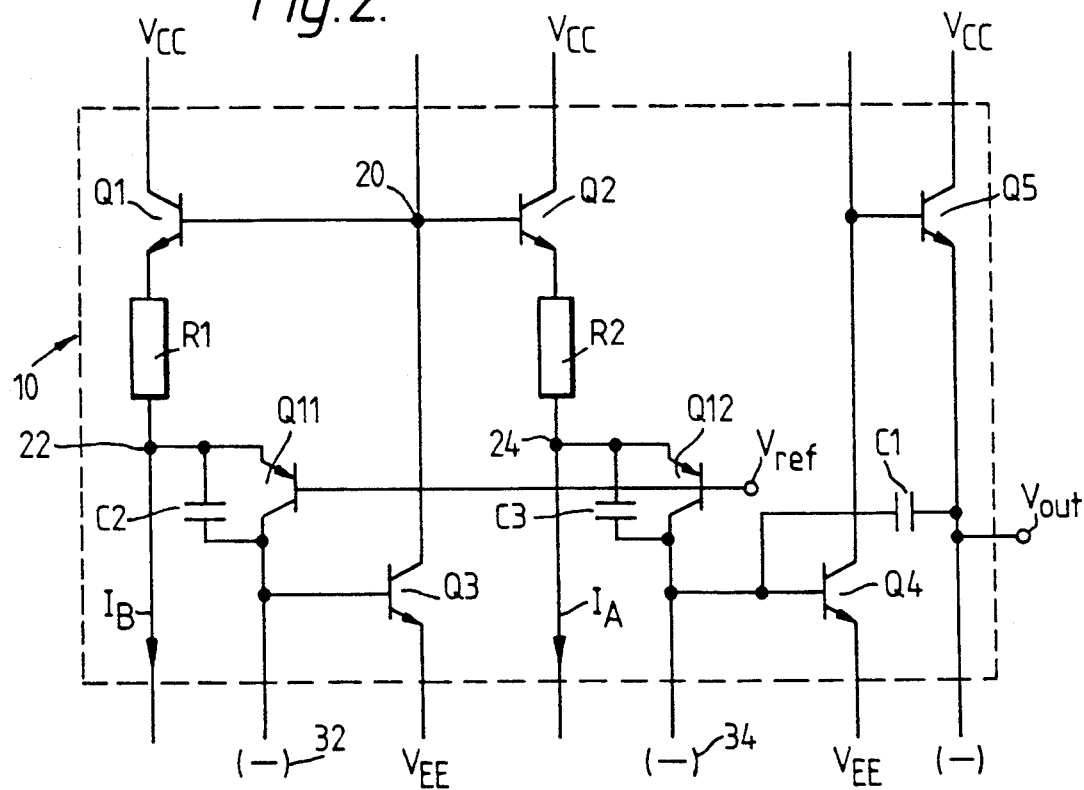
FIG. 2 is a circuit diagram of a second embodiment of a circuit in accordance with the present invention having a greater output voltage swing compared to the first embodiment.

In order to be able to simultaneously increase the transconductor input and operational amplifier output voltage swings, the circuit 10 can be modified as shown in FIG. 2. The emitter-collector circuits of common base connected PNP transistors Q11 and Q12 are connected respectively between the junction 22 and the base electrode of the transistor Q3 and between the junction 24 and the base electrode of the transistor Q4. The collector electrodes of the transistors Q11 and Q12 are connected to respective current sources 32, 34 which may produce a different current to that produced by the transistors Q9, Q10 (FIG. 1) and supplied to the emitter circuit of the transistor Q5. Capacitors C2, C3 are connected across the emitter-collector junctions of the transistors Q11, Q12, respectively. The base electrodes of the transistors Q11, Q12 are connected to $v_{ref}$ which sets the potential at the junctions 22, 24 and the emitter electrodes of the transistors Q3, Q4 are connected to the voltage supply line $V_{EE}$. The value of $V_{ref}$ is chosen to optimise the input and output voltage swings.

The transistors Q11, Q12 separate the junctions 22, 24 from the base electrodes of the respective transistors Q3, Q4 so that the voltages at the junctions 22, 24 can vary relative to the voltages at the base electrodes of the transistors Q3, Q4. The choice of the values of the capacitors C2, C3 is such that at high frequencies their impedances approach that of a short circuit.

Figure 3:
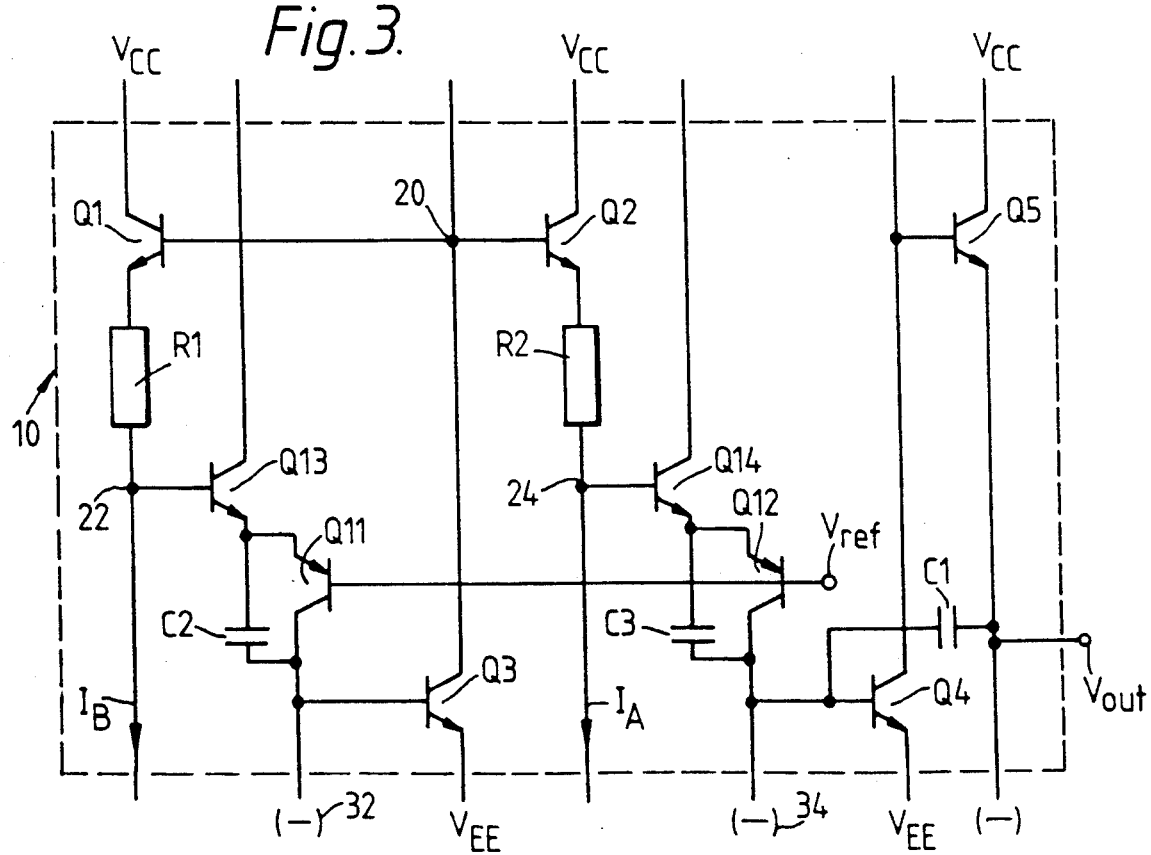
FIG. 3 is a circuit diagram of a third embodiment of a circuit in accordance with the present invention having an improved signal to noise ratio compared to the circuit shown in FIG. 2.

In certain applications, the noise introduced by the PNP transistors Q11, Q12 may be unacceptably high and in order to overcome this problem the circuit of FIG. 2 can be modified as shown in FIG. 3 by connecting current amplifiers, NPN transistors Q13, Q14, between the junctions 22, 24 and the emitters of the transistors Q11, Q12, respectively. The current amplifiers simply amplify the signal currents prior to their being applied to the level shifting transistors Q11, Q12 thereby enabling an acceptable signal-to-noise ratio to be maintained.

From reading the present disclosure, other modifications will be apparent to persons skilled in the art. Such modifications may involve other features which are already known in the design, manufacture and use of current differencing and operational amplifier circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any modification thereof, whether or not it relates to the same invention as presently claimed in any claim and whether or not it mitigates any or all of the same technical problems as does the present invention.

We claim:

1. A combined current differencing and operational amplifier circuit comprising: first, second, third, fourth and fifth NPN transistors each having base, emitter and collector electrodes, a feedback element, first and second resistive elements having first and second ends, wherein the base electrodes of the first and second transistors are connected together to form a junction, the first ends of the first and second resistive elements are connected to the emitter electrodes of the first and second transistors, respectively, the base and collector electrodes of the third transistor are coupled respectively to the second end of the first resistive element and to said junction, the base and collector electrodes of the fourth transistor are coupled respectively to the second end of the second resistive element and to the base electrode of the fifth transistor, and wherein the feedback element is connected between the base electrode of the fourth transistor and the emitter electrode of the fifth transistor, first and second signal inputs coupled to the second ends of the first and second resistive elements, respectively and a signal output being derived from the emitter circuit of the fifth transistor.

2. A circuit as claimed in claim 1, wherein the feedback element comprises a capacitive element.

3. A circuit as claimed in claim 1, wherein the feedback element comprises a resistive element.

4. A circuit as claimed in claim 1, further comprising a transconductor having first and second signal outputs coupled respectively to said first and second signal inputs.

5. A circuit as claimed in claim 1 further comprising a bias voltage line connected to the collector electrodes of the first, second and fifth transistors and a reference voltage line coupled to the emitter electrodes of the third and fourth transistors.

6. A circuit as claimed in claim 5, further comprising first and second PNP transistors having emitter, base and collector electrodes, the emitter-collector circuits of the first and second PNP transistors being coupled between the second ends of the first and second resistive elements and the base electrodes of the third and fourth NPN transistors, respectively, means connecting first and second capacitive elements in parallel with the collector-emitter circuits of the first and second PNP transistors, respectively, and wherein the base electrodes of the first and second transistors are connected to a source of reference voltage.

7. A circuit as claimed in claim 6, further comprising sixth and seventh NPN transistors having base, emitter and collector electrodes, and wherein the base-emitter paths of the sixth and seventh NPN transistors are connected respectively between the second ends of the first and second resistive elements and the emitter electrodes of the first and second PNP transistors.

8. A circuit as claimed in claim 7 wherein the first and second resistive elements are of substantially the same resistance value.

9. A circuit as claimed in claim 8 wherein the first to fifth transistors are substantially identical.

10. A circuit as claimed in claim 9 wherein the sixth and seventh transistors are substantially identical to the first to fifth transistors.

11. An integrated communications receiver including one or more of the circuits as claimed in claim 1.

12. A circuit as claimed in claim 1, further comprising first and second PNP transistors having emitter, base and collector electrodes, the emitter-collector circuits of the first and second PNP transistors being coupled between the second ends of the first and second resistive elements and the base electrodes of the third and fourth NPN transistors, respectively means connecting first and second capacitive elements in parallel with the collector-emitter circuits of the first and second PNP transistors, respectively, and wherein the base electrodes of the first and second transistors are connected to a source of reference voltage.

13. A circuit as claimed in claim 12, further comprising sixth and seventh NPN transistors having base, emitter and collector electrodes, and wherein the base-emitter paths of the sixth and seventh NPN transistors are connected respectively between the second ends of the first and second resistive elements and the emitter electrodes of the first and second PNP transistors.

14. A circuit as claimed in claim 13, wherein the first and second resistive elements are of substantially the same resistance value.

15. A circuit as claimed in claim 14, wherein the sixth and seventh transistors are substantially identical to the first to fifth transistors.

* * * * *

UNITED STATES PATENT AND TRADEMARK OFFICE
CERTIFICATE OF CORRECTION

PATENT NO. : 5,023,568
DATED : June 11, 1991
INVENTOR(S) : Paul A. Moore, et al

It is certified that error appears in the above-indentified patent and that said Letters Patent is hereby corrected as shown below:

Column 3, line 63, delete "Q3, the potential at the emit-";
        line 64, delete in its entirety;
        line 65, change "junction of the transistor Q1,"
               to --Q4 being substantially the same as
               that across the resistor R1 and the base-
               emitter junction of the transistor Q3,--.

Column 4, line 25, change "for example" to --, for example,--.

Signed and Sealed this

Seventh Day of December, 1993

Attest:

BRUCE LEHMAN

Attesting Officer      Commissioner of Patents and Trademarks